METHOD FOR THE PRODUCTION OF A GERMANIUM PLANAR TRANSISTOR

Filed July 7, 1970

3,690,967

METHOD FOR THE PRODUCTION OF A GERMANIUM PLANAR TRANSISTOR

Helmut Schadlich and Wolfgang Schembs, Munich, Germany, assignors to Siemens Aktiengesellschaft, Munich, Berlin and Erlangen, Germany Filed July 7, 1970, Ser. No. 52,912
Claims priority, application Germany, July 9, 1969, P 19 34 820.0
Int. Cl. H01l 7/44
U.S. Cl. 148—187 1 Claim

ABSTRACT OF THE DISCLOSURE

A method for the production of a germanium planar transistor, wherein the base zone and the emitter zone are being produced through indiffusion of doping materials into a germanium monocrystal of a certain conductivity type. Donors are diffused into the adjoining germanium surface from a donor containing $SiO_2$ layer. The germanium surface is masked with an interim layer consisting of pure $SiO_2$ outside the area which is to be diffused with donors. The donor containing $SiO_2$ layer is used as a mask in the acceptor diffusion.

Figure 1:
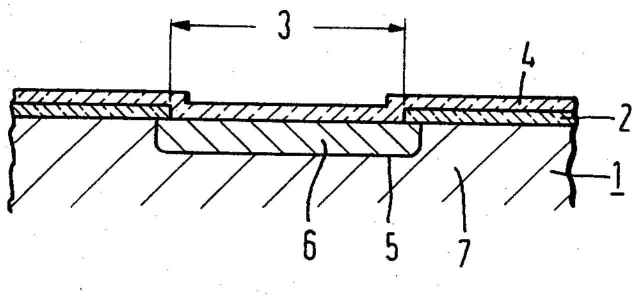

The invention relates to a method for the production of a germanium planar transistor, whereby the base zone and the emitter zone are being produced through indiffusion of doping materials into a germanium monocrystal of a certain conductivity type, which is covered with a masking protective layer, with the exception of the respective doping areas.

The planar technique which had been developed for the production of silicon transistors may, as is known, also be used, for the production of germanium planar transistors, provided the germanium surface is covered with appropriate masking layers, such as $SiO_2$, prior to the necessary diffusion processes. The masking layer must thereby be either precipitated thermally or applied by vapor deposition from a reaction gas upon the surface of the germanium crystal, which could possibly be heated. A masking layer thus produced shows, when certain dopants are being diffused into the germanium crystal, a masking effect at the coated places, similar to that in a silicon crystal, by an $SiO_2$ layer produced by thermal oxidation.

Up to now, the production of double diffused transistors on a germanium base failed, because no suitable masking layer was known for the diffusion of acceptors, such as gallium or indium, or because the diffusion coefficient of the acceptors, aluminum and boron, which can be masked with $SiO_2$, did not permit economical operation because of long diffusion periods. Our invention has as its object obviating the difficulties and permitting the ready production of double diffused germanium transistors.

The present invention exploits the fact that a donor containing $SiO_2$ layer masks gallium for the production of a germanium planar transistor with diffused emitter, by using the donors of the $SiO_2$ layer for the base diffusion. The germanium surface, outside of the place of diffusion, must be provided with an additional layer of pure $SiO_2$ to mask these donors.

The invention provides, with regard to the previously defined method for the production of a germanium planar transistor, that in a germanium monocrystal, donors are diffused into the adjoining germanium surface from a donor containing $SiO_2$ layer, the germanium surface being masked with an interim layer consisting of pure $SiO_2$ outside the area which is to be diffused with donors, and the donor containing $SiO_2$ layer is used as a mask for the acceptor diffusion.

The invention lends itself particularly well to the production of germanium pnp planar transistors with diffused emitters. In this case, one starts with a p-conducting monocrystalline germanium disk whose surface is initially provided with a thermally precipitated layer of pure $SiO_2$. The diffusion window, which is necessary for the production of the base zone, is etched into this $SiO_2$ layer. Thereafter, this arrangement is being coated everywhere, including the area within the diffusion window, with a continuous layer consisting of donor containing $SiO_2$, which is precipitated from the gas phase, using a suitable reaction gas. The precipitation of $SiO_2$ from a reaction gas is known per se. This $SiO_2$ layer contains considerably more donor material than the concentration in the adjoining germanium of acceptor atoms. The result is that a subsequent heat treatment permits donor atoms to diffuse into the germanium surface which was not covered by the $SiO_2$ layer. During the production of the p-conducting emitter, this donor containing $SiO_2$ layer serves as mask for the acceptor atoms from the gas phase.

For this purpose, a diffusion window, corresponding to the emitter geometry is etched into the donor containing $SiO_2$ layer, within the area of the previously produced diffusion window, through which acceptors, for instance, gallium atoms, are then diffused into the base zone, whereby an emitter zone develops in the base zone. In order to obtain a sufficient masking stability towards the acceptor atoms, it is necessary that the donor containing $SiO_2$ layer has a concentration of donors which correspond at least to the molar ratio phosphorus:silicon=1.7. The upper limit is obtained by the maximum solubility of the donors in $SiO_2$ of phosphorus:silicon=1.2. Thus there is from 6–16 volume-percent. A ratio of 1:4 (10% by volume) for example useful.

The thickness of the masking layer of pure $SiO_2$ corresponds to the ratio known for the diffusion masking for donors applicable to germanium planar transistors. Advantageously, the thickness is $0.2\mu$. The layer thickness of the donor containing $SiO_2$ layer, for sufficient masking, must be at least $0.1\mu$ and is preferably $0.3\mu$.

Figure 2:
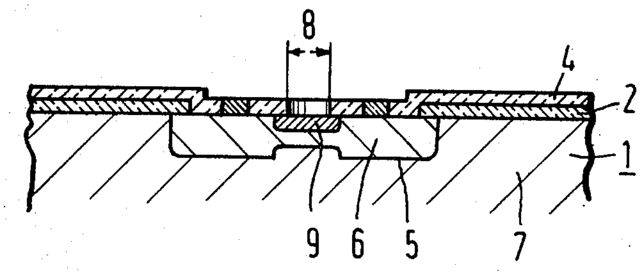

The method of the invention will now be described in greater detail for the already outlined production of a pnp germanium planar transistor, with respect to the drawing, in which:

FIGS. 1 and 2 show different stages of production.

Monocrystalline germanium disks serve as starting material for the process according to the invention. The planar surfaces of the disks which are exposed to the aforementioned processes, are advantageously oriented in a crystal plane with low Miller's Indices (Index Values: 0, ±1, ±2). A minor deviation from such a plane amounting to 0.5–2° may be advantageous. However, such deviation must follow a defined pattern.

A layer having a thickness of approximately $0.1$–$0.3\mu$, and consisting of pure $SiO_2$, is precipitated, for instance through pyrolytic dissociation of a organosilicon compound, for instance, a volatile silicic acid ester, on the surface of the p-conducting monocrystalline germanium disk 1. In a known manner, using the photoresist technique, a diffusion window is etched into this layer, in a defined manner. The germanium body is doped, for instance with $10^{15}$ indium atoms per cm.$^3$, while the $SiO_2$ layer 2 is practically free of dopants. The arrangement, thereafter, is totally coated with a donor containing $SiO_2$ layer, for instance, having a thickness of $0.3\mu$. The method already mentioned, whereby phophorus atoms are added in the form of volatile phosphorus acid esters, may be used. This layer which has the reference numeral 4, may have a glossy consistency.

In the next step, the diffusion of the donors into the surface of the germanium crystal 1 takes place at the location of window 3. For this purpose, the arrangement is being heated for about 25 minutes in a neutral or greatly reducing atmosphere, to a temperature of 675° C., for instance. During this process, donor material, in the present case phosphorus, diffuses in whereby a pn-junction 5 forms which in this case reaches a depth of approximately 0.1μ. It is obvious that the final depth of this pn-junction 5 in relation to the unchanged base material is further influenced by the subsequent emitter-diffusion, so that this has to be taken into account when measuring the total depth of penetration. On the other hand, it may be desirable that the emitter diffusion exert a direct influence upon the diffusion behavior of the donor atoms which dope the base zone, as will be shown hereinbelow. A temporary n-conducting base zone 6 with pn-junction 5 to the basic material 7 of the semiconductor disk has developed. FIG. 1 shows the state (condition) reached up to now.

The arrangement is now provided with the window needed for the emitter diffusion. This window 8, which passes through to the surface of the temporary base zone 6 is being etched in by customary planar technique. Subsequently, gallium is diffused in through this window. For this purpose, the arrangement is being embedded in a powder which had been produced from an alloy of germanium with 1–3% by volume of gallium. The gallium is then diffused into the arrangement, at a temperature of 800° C., for approximately 130 minutes, under protective atmosphere, whereby the emitter base pn-junction 9 develops. The penetration depth of this pn-junction 9 is approximately 0.7μ. The penetration depth of the pn-junction 5, after the emitter diffusion, is approximately 1.7μ at its deepest point. It should be noted that the center part of the collector base pn-junction 5 has lagged behind its marginal parts in further diffusion into the original body. However, this center part defines the effective base zone. Thus, the meridional cross section of the base zone becomes, by necessity, n-shaped, a fact which is of great importance for the high frequency behavior of the transistor.

The above arrangement is now provided with vaporizing contacts for emitter and base, by the usual technique. For instance, one can use a photoresist mask in order to obtain a "vaporizing mask" which keeps the desired places of the semiconductor surface free. As contacting metal, a chromium layer having a thickness of approximately several hundred A. is being applied through vaporizing, upon which a silver layer having a thickness of approximately 2000 A. is applied. At places, which are coated with photoresist, the vapor deposited metal is also removed when the photolacquer is removed, for instance, by the lifting off technique.

In cases in which an extremely low ohmic contact of the emitter zone and base zone is desired, special contact metals are being applied prior to the establishment of the vaporizing contacts. These contact metals are, for instance, gold/gallium for the emitter, gold/antimony and/or silver/antimony for the base. The lifting off technique is also used.

After the scoring and breaking of the germanium disk, in which usually a multitude of such transistors are advantageously produced, the systems obtained are mounted in metal housings or conductor bands with plastic casing as is in the customary manner.

We claim:

1. A method of producing a pnp transistor which comprises coating the surface of a p-conducting germanium wafer (1), which is monocrystalline and doped with approximately $10^{15}$ indium atoms/cm.$^3$, with a first protective layer (2) which consists of pure $SiO_2$ and has a first diffusion window (3) open to the germanium, coating said first protective layer and the germanium which is exposed in said first diffusion window (3), with a second protective layer (4) of $SiO_2$ compounded with phosphorus in a mole ratio of P:Si of at least 1:7, diffusing phosphorus from said second protective layer (4) into the germanium below said first diffusion window (3), to a depth of about 0.1μ to form the resultant collector-base-pn junctions (5) and forming in the second protective layer (4) and wholly within the area of the first diffusion window (3), a second diffusion window (8) which extends to the germanium, embedding the thus treated wafer into a germanium-gallium alloy powder containing 1 to 3% by volume of gallium, heating said embedded wafer until an emitter-base pn junction occurs thereby in the second diffusion window (8), to a depth of approximately 0.7μ in the germanium, removing the protective layers and attaching electrodes in the germanium wafer.

References Cited

UNITED STATES PATENTS

| | | | |
|---|---|---|---|
| 3,341,381 | 9/1967 | Bergman et al. | 148—187 |
| 3,408,238 | 10/1968 | Sanders | 148—187 |
| 3,539,401 | 11/1970 | Yamashita | 148—188 X |
| 3,583,857 | 6/1971 | Meer et al. | 148—187 X |

TOBIAS E. LEVOW, Primary Examiner

J. COOPER, Assistant Examiner

U.S. Cl. X.R.

148—188, 189